(12) United States Patent
Jeon et al.

(10) Patent No.: US 8,898,377 B2
(45) Date of Patent: Nov. 25, 2014

(54) SEMICONDUCTOR DEVICE AND METHOD OF GENERATING RANDOM DATA

(75) Inventors: Tae Ho Jeon, Gyeonggi-do (KR); Won Sun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 143 days.

(21) Appl. No.: 13/603,364

(22) Filed: Sep. 4, 2012

(65) Prior Publication Data

US 2013/0083619 A1 Apr. 4, 2013

(30) Foreign Application Priority Data

Oct. 4, 2011 (KR) ........................ 10-2011-0100713

(51) Int. Cl.
| | |
|---|---|
| *G06F 12/14* | (2006.01) |
| *G06F 11/07* | (2006.01) |
| *G06F 7/76* | (2006.01) |
| *G11C 16/10* | (2006.01) |
| *G11C 16/34* | (2006.01) |
| *G11C 7/10* | (2006.01) |
| *G11C 16/04* | (2006.01) |
| *H04N 19/61* | (2014.01) |

(52) U.S. Cl.
CPC ............ *G11C 16/10* (2013.01); *G06F 12/1408* (2013.01); *G06F 7/764* (2013.01); *G06F 11/0703* (2013.01); *G06F 2212/1036* (2013.01); *G11C 16/34* (2013.01); *G11C 7/1006* (2013.01); *G11C 16/0483* (2013.01); *G11C 16/3418* (2013.01); *H04N 19/00781* (2013.01)
USPC ..................... 711/103; 711/154; 711/E12.008

(58) Field of Classification Search
CPC ....... G06F 7/584; G06F 7/764; G06F 11/002; G06F 11/004; G06F 11/0703; G06F 12/1408; G06F 2212/1032; G06F 2212/1036; G06F 2212/7203
USPC ................................ 711/103, 154, E12.008
See application file for complete search history.

(56) References Cited

U.S. PATENT DOCUMENTS

| | | | |
|---|---|---|---|
| 8,059,455 B2 * | 11/2011 | Stern et al. ............... | 365/185.02 |
| 2009/0172266 A1 * | 7/2009 | Kimura ......................... | 711/103 |
| 2009/0316490 A1 * | 12/2009 | Takada ..................... | 365/185.26 |
| 2010/0329033 A1 * | 12/2010 | Kamigaichi ............. | 365/185.24 |
| 2011/0035539 A1 * | 2/2011 | Honda ........................ | 711/103 |
| 2012/0005416 A1 * | 1/2012 | Lee et al. ..................... | 711/103 |
| 2012/0297111 A1 * | 11/2012 | Hsu et al. .................... | 711/103 |

* cited by examiner

*Primary Examiner* — Hal Schnee
(74) *Attorney, Agent, or Firm* — IP & T Group LLP

(57) ABSTRACT

A semiconductor device includes a first operation circuit configured to generate addition data by adding a column address and a page address and output a remainder obtained by dividing the addition data by a set value as seed data, a mask data output circuit configured to output mask data corresponding to the respective seed data, and a second operation circuit configured to generate random data by performing a logic operation on the mask data and program data corresponding to the column and page addresses.

16 Claims, 3 Drawing Sheets

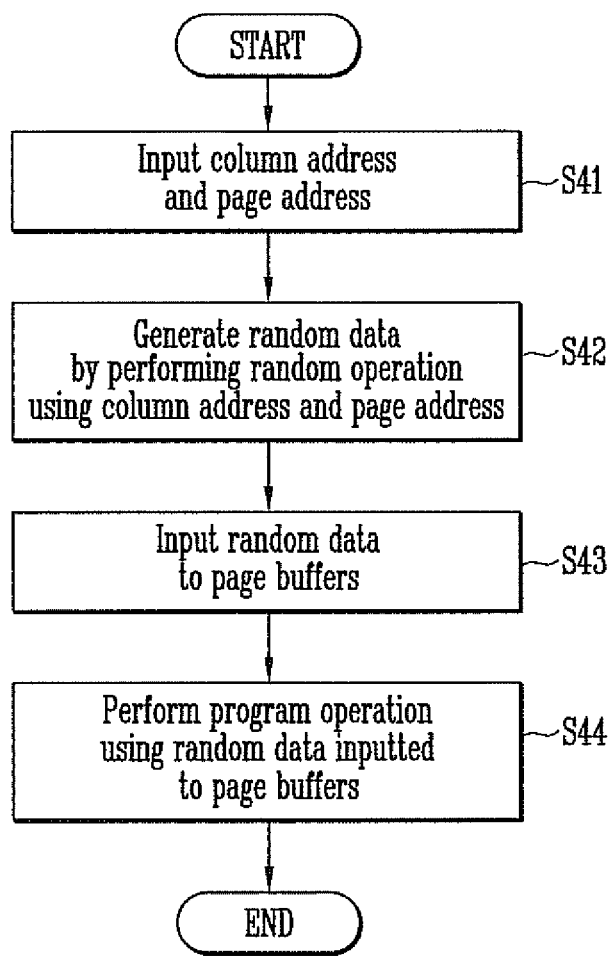

SEMICONDUCTOR DEVICE AND METHOD OF GENERATING RANDOM DATA

CROSS-REFERENCE TO RELATED APPLICATION

Priority to Korean patent application number 10-2011-0100713 filed on Oct. 4, 2011, the entire disclosure of which is incorporated by reference herein, is claimed.

BACKGROUND

Embodiments of this disclosure relate to a semiconductor device and a method of operating the same and, more particularly, to a random data generator and a method of generating random data using the same.

A semiconductor device includes an input/output (I/O) circuit configured to receive external program data and externally output data stored in a memory cell array, a column selector configured to sequentially input the program data to page buffers, and the page buffers configured to transfer the received program data to bit lines under the control of a controller.

A program operation of the semiconductor device configured as above is described in short below. The external program data is transferred to the page buffers selected in response to column addresses. When the program data transferred to the page buffers is loaded into the bit lines, there is a difference in the potential among the bit lines. When a program voltage is supplied to a selected word line, selected memory cells are programmed in response to the program voltage and the potentials of the bit lines.

Meanwhile, with an increase in the degree of integration of semiconductor devices, the number of memory cells included in a memory cell array increases, but an interval between the memory cells becomes narrowed. This may increase interference between the memory cells when program data of a specific pattern is inputted. For example, among the plurality of memory cells of the memory cell array, if data is concentrically stored in memory cells placed in a specific region and memory cells placed in other regions maintain an erase state, a difference between electric fields occurs within the memory cell array. The difference between the electric fields may increase interference between the memory cells and deteriorate a retention characteristic, thereby decreasing reliability of the semiconductor device.

Therefore, technology for decreasing a difference between electric fields in the memory cell array by randomizing external program data without programming the external program data into memory cells in the order of being inputted is being developed. In this technology, since random data is chiefly generated using a column address, a semiconductor device may have a limit in randomization using the column address.

BRIEF SUMMARY

An exemplary embodiment of this disclosure relates to a semiconductor device having an improved random ratio in a program operation by generating random data using a column address and a page address.

In an embodiment of this disclosure, a semiconductor device includes a first operation circuit configured to generate addition data by adding a column address and a page address and output a remainder obtained by dividing the addition data by a set value as seed data; a mask data output circuit configured to output mask data corresponding to randomize the respective seed data; and a second operation circuit configured to generate random data by performing a logic operation on the mask data and program data corresponding to the column and page addresses.

In another embodiment of this disclosure, a semiconductor device includes a memory cell array comprising a plurality of memory cells arranged in column and row lines; page buffers coupled to the column lines of the memory cell array; a random data generator configured to generate seed data by performing a first logical operation on a column address for selecting the column lines and a page address for selecting the row lines and generate random data by performing a second logical operation on program data corresponding to the column and page addresses and mask data corresponding to the respective seed data; and a column selector configured to transfer the random data to the page buffers in response to the column address.

In yet another embodiment of this disclosure, a method of operating a semiconductor device includes adding a column address and a page address; generating seed data using the remainder obtained by dividing the added value by a set value; outputting mask data corresponding to the respective seed data; generating random data by performing a logic operation on the mask data and program data corresponding to the column and page addresses; and performing a program operation using the random data.

BRIEF DESCRIPTION OF THE DRAWINGS

FIG. 4 is a flowchart illustrating a program method according to an exemplary embodiment of this disclosure.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
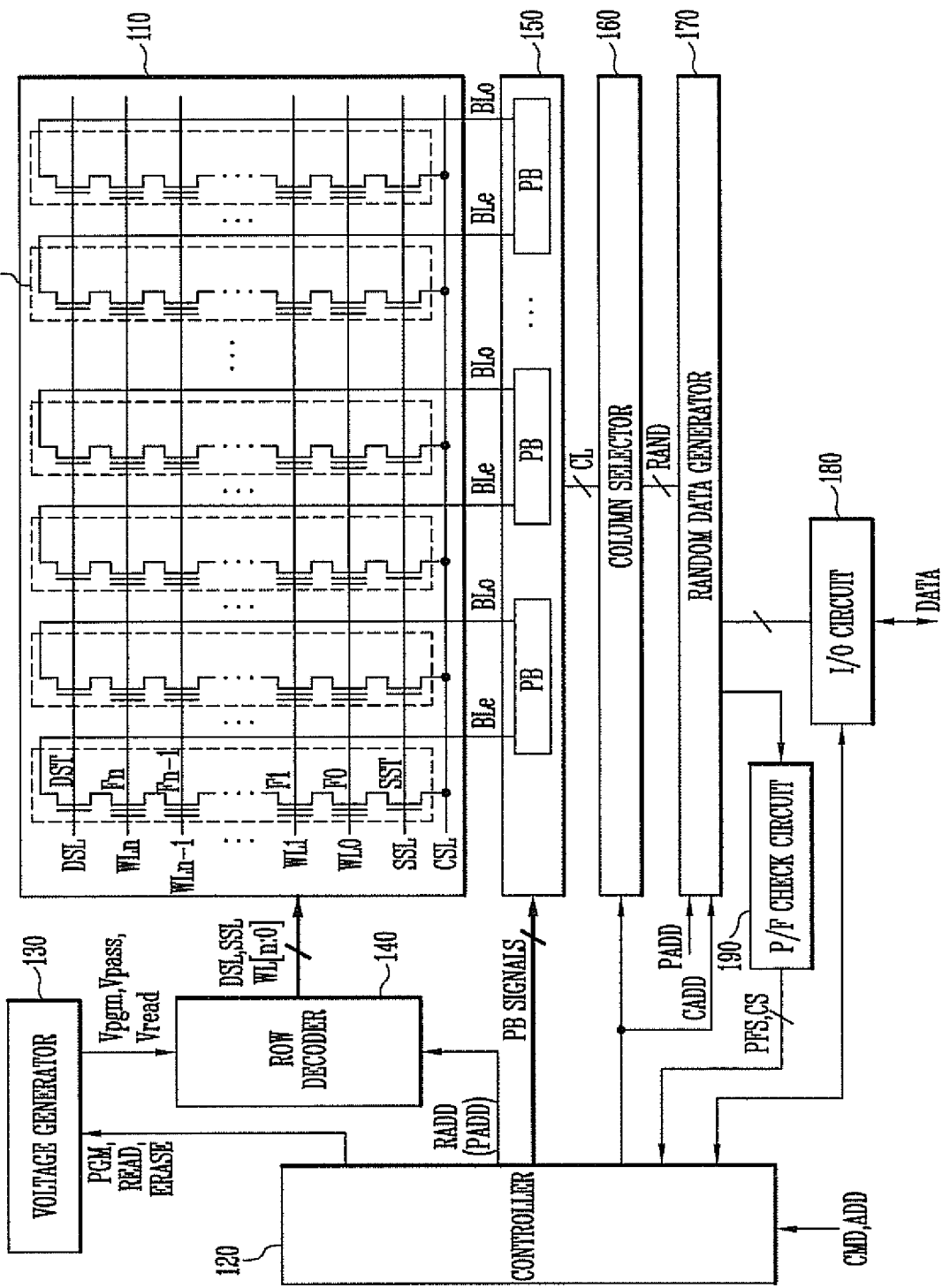
FIG. 1 is a block diagram illustrating a semiconductor device according to an exemplary embodiment of this disclosure.

FIG. 1 is a block diagram illustrating a semiconductor device according to an exemplary embodiment of this disclosure.

Referring to FIG. 1, the semiconductor device includes a memory cell array 110, a circuit group (130, 140, 150, 160, 170, 180, and 190) configured to perform a program operation, a read operation, or an erase operation on memory cells included in the memory cell array 110, and a controller 120 configured to control the circuit group (130, 140, 150, 160, 170, 180, and 190) in order to set the threshold voltages of selected memory cells based on input data.

In case of a NAND flash memory device, the circuit group includes a voltage generator 130, a row decoder 140, a page buffer group 150, a column selector 160, a random data generator 170, an I/O circuit 180, and a pass/fail (P/F) check circuit 190.

The memory cell array 110 includes a plurality of memory blocks. One of the memory blocks is illustrated in FIG. 1. The memory block includes a plurality of strings ST. The strings ST have the same configuration. Each of the strings ST includes a source select transistor SST coupled to a common source line CSL, a plurality of memory cells F0 to Fn, and a drain select transistor DST coupled to a bit line BL. The gate of the source select transistor SST is coupled to a source select line SSL, the gates of the memory cells F0 to Fn are coupled to respective word lines WL0 to WLn, and the gate of the drain select transistor DST is coupled to a drain select line DSL. The strings ST are coupled to respective bit lines BLe and BLo and are coupled the common source line CSL in common.

The controller 120 internally generates a program operation signal PGM, a read operation signal READ, or an erase operation signal ERASE in response to a command signal CMD and also generates control signals PB SIGNALS for controlling the page buffers PB of the page buffer group 150 depending on the type of operation, Furthermore, the controller 120 internally generates a row address signal RADD, including a page address PADD, and a column address signal CADD in response to an address signal ADD. One of plurality of memory blocks included in the memory cell array 110 is selected in response to the row address RADD, a page of the selected memory block is selected in response to the page address PADD, and the page buffers PB of the page buffer group 150 are selected in response to the column address CADD.

Furthermore, the controller 120 checks whether the threshold voltages of selected memory cells have reached a target voltage or not in response to a check signal PFS generated from the P/F check circuit 190 in a program or erase verification operation. The controller 120 determines whether or not to perform a program or erase operation again, whether or not to terminate the program or erase operation, or whether the program or erase operation has failed or not depending on a result of the check.

A voltage supply circuit (130 and 140) supplies voltages used for the program operation, read operation, or erase operation of memory cells to the drain select line DSL, the word lines WL0 to WLn, and the source select line SSL of a selected memory block in response to the signals PGM, READ, ERASE, and RADD of the controller 120. The voltage supply circuit includes the voltage generator 130 and the row decoder 140.

The voltage generator 130 outputs operating voltages for programming, reading, and erasing memory cells to global lines in response to the operating signals PGM, READ, and ERASE of the controller 120. For example, the voltage generator 130 outputs operating voltages Vpgm and Vpass for a program to the global lines if memory cells are sought to be programmed.

The row decoder 140 transfers the operating voltages Vpgm, Vpass, and Vread of the voltage generator 130 to the local lines DSL, SSL, and WL[n:0] of a selected memory block in response to the row address signals RADD of the controller 120.

The page buffer group 150 detects the program state or the erase state of memory cells under the control of the controller 120. The page buffer group 150 includes the page buffers PB each coupled to the bit lines BLe and BLo. The page buffer group 150 supplies voltages for storing data in the memory cells F0 to Fn to the bit lines BLe and BLo in response to the page buffer signals PB SIGNALS of the controller 120.

Particularly, the page buffer group 150 precharges the bit lines BLe and BLo when a program operation, a read operation, or an erase operation is performed on the memory cells F0 to Fn or latches data corresponding to the threshold voltages of the memory cells F0 to Fn which are detected depending on a change in the voltages of the bit lines BLe and BLo. That is, in the program operation, the page buffer group 150 supplies a program permission voltage (for example, 0 V) or a program inhibition voltage (for example, Vcc) to the bit lines BLe or BLo based on data stored in the latches of the page buffers PB. In the read operation, the page buffer group 150 detects data stored in the memory cells F0 to Fn by sensing the voltages of the bit lines BLe and BLo. Furthermore, at the early stage of the erase operation, the page buffer group 150 supplies an erase permission voltage (for example, Vcc) to the bit lines BLe and no. During the erase operation, the page buffer group 150 supplies the program permission voltage (for example, 0 V) to bit lines coupled to strings ST which are determined to be erased as a result of an erase verification operation. The program permission voltage is determined by data stored in the latches of the page buffers depending on a result of an erase verification operation.

The column selector 160 selects the page buffers PB of the page buffer group 150 in response to the column address CADD of the controller 120 and transfers random data RAND, generated from the random data generator 170, to a selected page buffer PB.

The random data generator 170 performs a logic operation on the column address CADD and the page address PADD, generates seed data based on a result of the operation, and outputs mask data using the seed data. Next, the random data generator 170 performs a logic operation on received program data DATA and the mask data and generates random data RAND based on a result of the operation. Furthermore, in a verification operation or a read operation, the random data generator 170 transfers data, outputted from the column selector 160, to the P/F check circuit 190.

The I/O circuit 180 transfers program data DATA to the random data generator 170 when a program operation is performed and externally outputs data received from the random data generator 170 when a read operation is performed, under the control of the controller 120.

The P/F check circuit 190 checks whether an error cell has occurred or not in a verification operation subsequent to a program or erase operation and outputs a result of the check in the form of a check signal PFS. Furthermore, the P/F check circuit 190 counts the number of error cells and outputs a result of the count in the form of the count signal CS.

Figure 2:
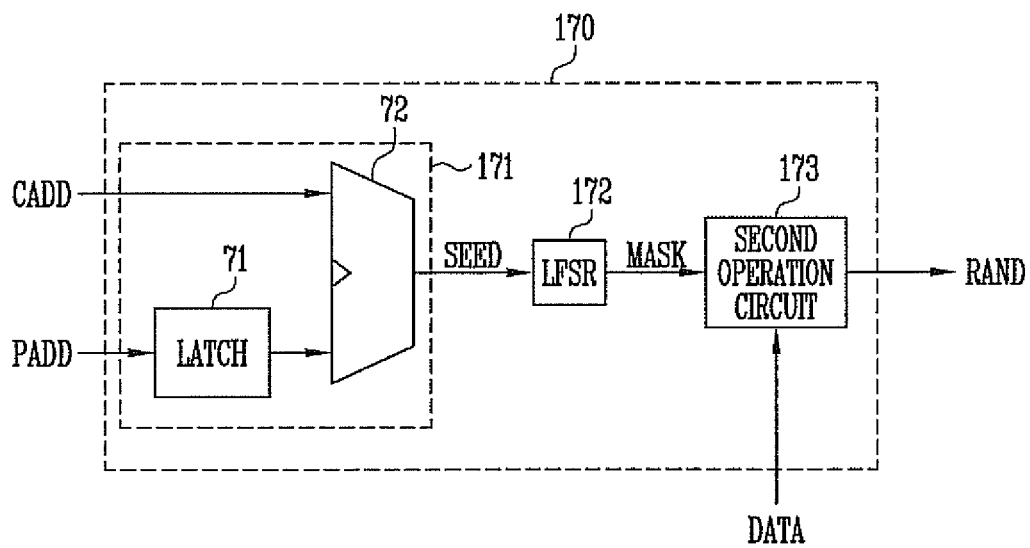
FIG. 2 is a block diagram illustrating an exemplary embodiment of a random data generator shown in FIG. 1.

FIG. 2 is a block diagram illustrating an exemplary embodiment of the random data generator 170 shown in FIG. 1.

Referring to FIG. 2, the random data generator 170 includes a first operation circuit 171 configured to generate seed data SEED by performing a logic operation on a column address CADD and a page address PADD, a mask data output circuit 172 configured to generate mask data MASK using the seed data SEED, and a second operation circuit 173 configured to generate random data RAND performing a logic operation on the mask data MASK and received program data DATA.

The first operation circuit 171 includes a latch 71 for storing the page address PADD and an adder 72 for adding the page address PADD and the column address CADD. The latch 71 is used to support a cache read operation. For example, if two or more latches are included in the page buffer PB, one latch is used to perform a read operation and the other latch may be used to output already read data externally. This read method is called the cache read operation. The cache read operation uses a previous page address PADD because a page address PADD for masking output data is different from a page address PADD for performing a read operation in the page buffer PB. Accordingly, the latch 71 of the first operation circuit 171 is used to store a previous page address PADD when a read operation is performed. In particular, the adder 72 is used when a randomization operation is performed using a linear feedback shift register (hereinafter referred to as an LFSR). Particularly, a value obtained by shifting data, produced by performing a logic operation on the column address CADD and the page address PADD, through the LFSR may be different from a value obtained by shifting data produced by performing a logic operation on the page address PADD. This is because the first column address CADD may start from a specific address as well as a number '0' in a flash memory device when a program or read operation is performed. Accordingly, it is preferred that the adder 72 be used when the LFSR is used.

The mask data output circuit 172 is embodied using an LFSR. The LFSR may be embodied in various ways, but it is chiefly embodied using a plurality of flip-flops and an XOR gate. The LFSR outputs randomized mask data MASK in response to a clock CLK when the seed data SEED is received.

The second operation circuit 173 generates the random data RAND by performing a logic operation on the mask data MASK and the program data DATA. For example, the second operation circuit 173 may generate the random data RAND by performing an XOR operation on the mask data MASK and the program data DATA. The generated random data RAND is sent to the page buffers PB selected in response to the column address CADD. A program operation is performed using the random data RAND sent to the page buffers PB. If the random data RAND is generated using the column address CADD and the page address PADD as described above, randomization is performed not only in the word line of a memory cell array, but also in the cell string thereof. Accordingly, interference may be prevented from occurring between memory cells adjacent in several ways.

A method of generating the random data RAND using the random data generator 170 is described below.

When the page address PADD and the column address CADD generated from the controller 120 are received, the adder 72 performs an addition operation on the page address PADD and the column address CADD and outputs the remainder, obtained by dividing the added value by a specific number, as the seed data SEED. Preferably, the specific number may be determined by an equation $2^n-1$. In the equation, 'n' is the number of bits of the mask data MASK. For example, if the mask data MASK is data of 8 bits, the specific number is 255. Accordingly, if the added value of the page address PADD and the column address CADD is divided by 255, the seed data SEED is any one of the remainders 0, 1, 2, 3 to 254. After the seed data SEED is generated, the LFSR 172 outputs the mask data MASK in response to the seed data SEED. The mask data MASK corresponds to the respective seed data SEED as in Table 1 below.

TABLE 1

| SEED | MASK |
|---|---|
| 0 | 11111111 |
| 1 | 11111110 |
| 2 | 11111100 |
| 3 | 11111000 |
| 4 | 11110000 |
| 5 | 11100001 |
| 6 | 11000010 |
| 7 | 10000101 |
| 8 | 00001011 |
| 9 | 00010111 |
| 10 | 00101111 |
| 11 | 01011110 |
| 12 | 10111100 |

TABLE 1-continued

| SEED | MASK |
|---|---|
| 13 | 01111000 |
| 14 | 11110001 |
| 15 | 11100011 |
| 16 | 11000110 |
| 17 | 10001101 |
| 18 | 00011010 |
| 19 | 00110100 |
| ... | ... |
| 254 | 0111111 |

If the seed data SEED correspond to the mask data MASK in a one-to-one way as in Table 1, the LFSR 172 may output mask data MASK corresponding to received seed data SEED, respectively. For example, when the page address PADD is '0000101', '0000101' is converted into '5' in a decimal number. Furthermore, when the column address CADD is '0000000000111', '0000000000111' is converted into '7' in a decimal number. When '5' and '7' are added, it results in '12'. When '12' is divided by '255', the remainder is '12'. Accordingly, the value of the seed data SEED becomes '12', and '10111100' corresponding to '12' is outputted as the mask data MASK. For another example, when the page address PADD is '0000101' (that is, '5' in a decimal number) and the column address CADD is '0000000000101' (that is, '5' in a decimal number), the value of the seed data SEED becomes '10', and thus '100101111' corresponding to '10' is outputted as the mask data MASK. The second operation unit 173 generates the random data RAND by performing an XOR operation on the generated mask data MASK and the program data DATA received through the I/O circuit 180 in a one-to-one way. For example, when the mask data MASK is '10111100' and the program data DATA is '101000110', the random data DATA of '1111101' is generated. The random data RAND is inputted to the page buffer group 150 instead of the program data DATA. A subsequent program operation is performed using the random data RAND.

Figure 3:
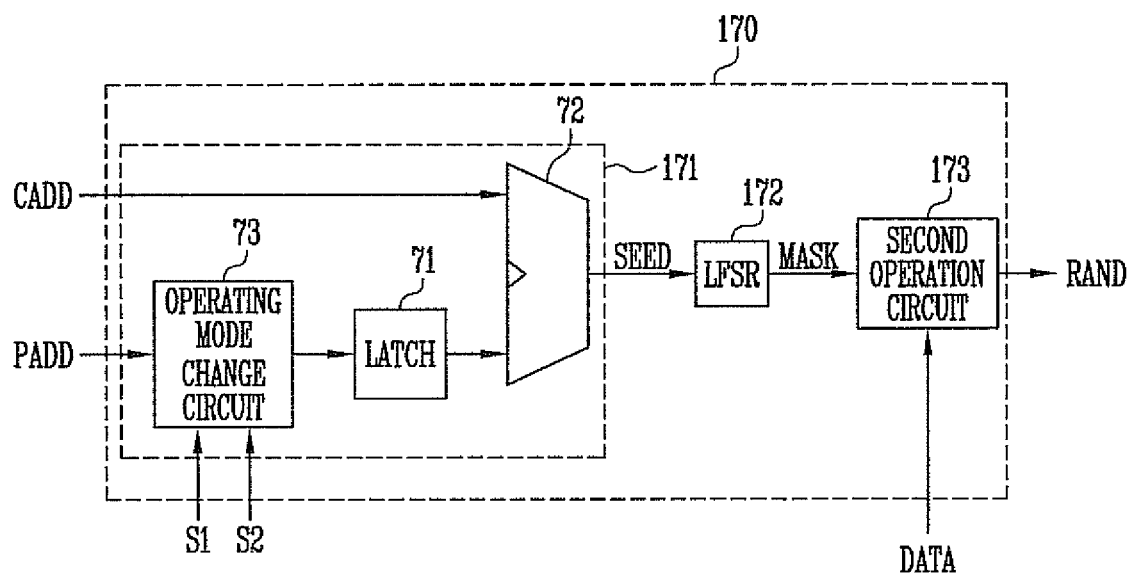
FIG. 3 is a block diagram illustrating another exemplary embodiment of the random data generator shown in FIG. 1.

FIG. 3 is a block diagram illustrating another exemplary embodiment of the random data generator 170 shown in FIG. 1.

Referring to FIG. 3, the random data generator 170 includes a first operation circuit 171 configured to generate seed data SEED by performing a logic operation on a column address CADD and a page address PADD, a mask data output circuit 172 configured to generate mask data MASK using the seed data SEED, and a second operation circuit 173 configured to generate random data RAND by performing a logic operation on the mask data MASK and received program data DATA.

The first operation circuit 171 includes an operating mode change circuit 73 configured to perform a logic operation on the page address PADD, a latch 71 configured to store the page address PADD, and an adder 72 configured to add the page address PADD and the column address CADD.

The operating mode change circuit 73 is included in order to support various operations. For example, the operating mode change circuit 73 may determine an operating mode in response to a first selection signal S1 and a second selection signal S2. For example, for a random mode, the operating mode change circuit 73 outputs a received page address PADD without change in response to the first selection signal S1 and the second selection signal S2 of '0'. That is, for randomization purposes in the direction of a page, the operating mode change circuit 73 outputs a received page address PADD without change. For a security mode, the operating mode change circuit 73 adds a specific security code to a received page address PADD in response to the first selection signal S1 of '0' and the second selection signal S2 of '1' and outputs the page address PADD to which the specific security code has been added. For a pattern mode, the operating mode change circuit 73 stores frequently used patterns and outputs data corresponding to a previously stored pattern in response to the first selection signal S1 of '1' and the second selection signal S2 of '0'. For a shift mode, the operating mode change circuit 73 performs a shift operation on a received page address PADD in response to the first selection signal S1 and the second selection signal S2 of '1' and outputs the shifted page address PADD. For example, when a received page address PADD is '100010', the operating mode change circuit 73 may shift the page address '100010' and outputs a shifted page address '0000101'. The operating modes of the operating mode change circuit 73 are described as an example, and various other operating modes may be used.

The latch 71 is used to support a cache read operation. For example, if two or more latches are included in the page buffer PB, one latch is used to perform a read operation and the other latch may be used to output already read data externally. This read method is called the cache read operation. The cache read operation uses a previous page address PADD because a page address PADD for masking output data is different from a page address PADD for performing a read operation in the page buffer PB. Accordingly, the latch 71 of the first operation circuit 171 is used to store a previous page address PADD when a read operation is performed. In particular, the adder 72 is used when a randomization operation is performed using a linear feedback shift register (hereinafter referred to as an LFSR). Particularly, a value obtained by twice shifting data, produced by performing a logic operation on the column address CADD and the page address PADD, through the LFSR may be different from a value obtained by shifting data produced by performing a logic operation on the page address PADD. This is because the first column address CADD may start from a specific address as well as a number '0' in a flash memory device when a program or read operation is performed. Accordingly, it is preferred that the adder 72 be used when the LFSR is used.

The mask data output circuit 172 is embodied using an LFSR. The LFSR may be embodied in various ways, but it is chiefly embodied using a plurality of flip-flops and an XOR gate. The LFSR outputs randomized mask data MASK in response to a clock CLK when the seed data SEED is received.

The second operation circuit 173 generates the random data RAND by performing a logic operation on the mask data MASK and the program data DATA. For example, the second operation circuit 173 may generate the random data RAND by performing an XOR operation on the mask data MASK and the program data DATA. The generated random data RAND is sent to the page buffers PB selected in response to the column address CADD. A program operation is performed using the random data RAND sent to the page buffers PB. If the random data RAND is generated using the column address CADD and the page address PADD as described above, randomization is performed not only in the word line of a memory cell array, but also in the cell string thereof. Accordingly, interference may be prevented from occurring between memory cells adjacent in several ways.

FIG. 4 is a flowchart illustrating a program method according to an exemplary embodiment of this disclosure.

Referring to FIG. 4, when a program operation is started in response to a program command, a column address CADD and a page address PADD generated from the controller 120 are inputted to the random data generator 170 at step S41. The random data generator 170 generates seed data SEED by adding the column address CADD and the page address PADD, randomizes the seed data SEED using the LFSR to generate mask data MASK, and then generates random data RAND using the mask data MASK and program data DATA at step S42. The random data generator 170 inputs the random data RAND to the page buffers PB in response to the column address CADD at step S43. A program operation is performed using the page buffers PB to which the random data RAND has been inputted at step S44.

When the random data RAND is generated using the column address CADD and the page address PADD as described above, a program operation may be performed without inclinations to form a specific pattern because randomization is performed not only in the direction of the word lines of a memory cell, but also in the direction of the cell string thereof. As a result, interference between memory cells adjacent in various ways may be decreased, and reliability of the semiconductor device may be improved.

In accordance with the exemplary embodiment, since random data is generated using both the column address and the page address, the random ratio of random data may be improved and interference within a memory cell array may be decreased owing to an improved random ratio. Accordingly, reliability of a semiconductor device may be improved.

What is claimed is:

1. A semiconductor device, comprising:
    a first operation circuit configured to generate addition data by adding a column address and a page address and output, as seed data, a remainder obtained by dividing the addition data by a set value;
    a mask data output circuit configured to output mask data corresponding to the seed data; and
    a second operation circuit configured to generate random data by performing a logic operation on the mask data and on program data corresponding to the column and page addresses.

2. The semiconductor device of claim 1, wherein the first operation circuit comprises:
    a latch configured to store the page address; and
    an adder configured to add the stored page address and the column address.

3. The semiconductor device of claim 2, further comprising an operating mode change circuit configured to determine an operating mode of the semiconductor device before storing the page address into the latch.

4. The semiconductor device of claim 3, wherein, in response to a first selection signal and a second selection signal, the operating mode change circuit;
    transfers the page address without change in a random mode of the semiconductor device;
    adds a specific security code to the page address and transfers an added page address in a security mode of the semiconductor device;
    transfers a stored address regardless of the page address in a pattern mode of the semiconductor device; and
    shifts the page address and transfers a shifted page address in a shift mode of the semiconductor device.

5. The semiconductor device of claim 1, wherein the mask data output circuit comprises a linear feedback shift register (LFSR) to output the mask data corresponding to the seed data.

6. The semiconductor device of claim 1, wherein the second operation circuit comprises an XOR operation circuit for generating the random data by performing an XOR operation on the mask data and the program data.

7. The semiconductor device of claim 1, wherein the set value is determined in response to a number of bits of the mask data.

8. A semiconductor device, comprising:
   a memory cell array comprising a plurality of memory cells arranged in column and row lines;
   page buffers coupled to column lines of the memory cell array;
   a first operation circuit configured to generate addition data by adding a column address and a page address and output, as seed data, a remainder obtained by dividing the addition data by a set value;
   a mask data output circuit configured to output mask data corresponding to the seed data;
   a second operation circuit configured to generate a random data by performing a second logic operation on the mask data and on program data corresponding to the column and page addresses; and
   a column selector configured to transfer the random data to the page buffers in response to the column address.

9. The semiconductor device of claim 8, wherein the first operation circuit comprises:
   a latch configured to store the page address; and
   an adder configured to add the stored page address and the column address.

10. The semiconductor device of claim 9, further comprising an operating mode change circuit configured to determine an operating mode of the semiconductor device before storing the page address into the latch.

11. The semiconductor device of claim 10, wherein the operating mode change circuit transfers the page address without change in a random mode of the semiconductor device, adds a specific security code to the page address and transfers an added page address in a security mode thereof, transfers a stored address regardless of the page address in a pattern mode thereof, and shifts the page address and transfers a shifted page address in a shift mode thereof, in response to a first selection signal and a second selection signal.

12. The semiconductor device of claim 8, wherein the mask data output circuit comprises a linear feedback shift register (LFSR) to output the mask data corresponding to the seed data.

13. The semiconductor device of claim 8, wherein the second operation circuit comprises an XOR operation circuit for generating the random data by performing an XOR operation on the mask data and the program data.

14. A method of operating a semiconductor device, comprising:
   adding a column address and a page address;
   generating seed data using a remainder obtained by dividing the added value by a set value;
   outputting mask data corresponding to the seed data;
   generating random data by performing a logic operation on the mask data and on program data corresponding to the column and page addresses; and
   performing a program operation using the random data.

15. The method of claim 14, wherein the generating of the random data comprises performing an XOR operation on the mask data and the program data.

16. The method of claim 14, wherein the generating of the mask data comprises outputting the mask data corresponding to the seed data using a linear feedback shift register (LFSR).

* * * * *